United States Patent [19]

Mazur et al.

[11] Patent Number: 5,036,271
[45] Date of Patent: Jul. 30, 1991

[54] APPARATUS FOR CHARACTERIZATION OF ELECTRICAL PROPERTIES OF A SEMICONDUCTOR BODY

[75] Inventors: Robert G. Mazur, Sewickley; Robert C. Stephenson, North Irwin; Donald A. Zier, Jr., Coraopolis, all of Pa.

[73] Assignee: Solid State Measurements, Inc., Pittsburgh, Pa.

[21] Appl. No.: 527,790

[22] Filed: May 23, 1990

[51] Int. Cl.$^5$ .................... G01R 31/02; G01R 31/22
[52] U.S. Cl. ............................ 324/158 P; 324/158 F
[58] Field of Search .............. 324/158 F, 158 P, 72.5, 324/719, 690, 724; 439/178, 179

[56] References Cited

U.S. PATENT DOCUMENTS

| | | | |
|---|---|---|---|
| 3,628,137 | 12/1971 | Mazur | 324/158 T |
| 3,794,912 | 2/1974 | Severin et al. | 324/158 P |
| 4,101,830 | 7/1978 | Greig | 324/158 F |
| 4,409,547 | 10/1983 | Lederman | 324/158 F |
| 4,587,484 | 5/1986 | Shulman | 439/179 |

FOREIGN PATENT DOCUMENTS

2741682 6/1980 Fed. Rep. of Germany .

OTHER PUBLICATIONS

Philip S. Schaffer & Thomas R. Lally, "Silicon Epitarial Wafer Profiling Using the Mercury-Silicon Schettky Diode Differential Capacitance Methods", Solid State Technology, pp. 229-233 Apr. 1983.

Peter S. Burggraaf, "C-V Plotting, C-T Measuring and Dopant Profiling: Applications and Equipment," Semiconductor International, pp. 29-35, Oct. 1980.

Albert Lederman, "Vacuum Operated Mercury Probe for C-V Plotting and Profiling", Solid State Technology, pp. 123-126 Aug. 1981.

*Primary Examiner*—Kenneth A. Wieder
*Assistant Examiner*—Vinh P. Nguyen
*Attorney, Agent, or Firm*—Ronald S. Lombard

[57] ABSTRACT

An apparatus for the measurement of electrical properties of a semiconductor wafer is disclosed. A top contact mercury probe for contacting the upper surface of a wafer body is provided. The mercury probe is held by a kinematically stable probe arm which provides for very controlled movement of the mercury probe. A semiconductor wafer body horizontal and rotational movement system is provided for moving the wafer body to provide mapping capability. A top side return contact for doing measurements on wafer bodies with insulating substrates is disclosed. The top side return contact is also provided with a self-levelling and raising function, which ensures the bottom surface of the contact member to intimately contact the upper surface of the wafer body when desired, and also to raise the contact member off the wafer body when the bottom contact underneath the wafer is utilized.

5 Claims, 2 Drawing Sheets

APPARATUS FOR CHARACTERIZATION OF ELECTRICAL PROPERTIES OF A SEMICONDUCTOR BODY

BACKGROUND OF THE INVENTION

This invention relates generally to an apparatus for characterization of electrical properties of a semiconductor body, and, in particular, to the measurements of the electrical properties of a semiconductor wafer body using a mercury column as one of the contacts. The use of a mercury column as a non-invasive contact for measurements of the electrical properties of a semiconductor wafer material is well known in the art. Measurements such as dopant density, capacitance-voltage and current-voltage measurements may be accomplished utilizing such a mercury column contact. The mercury column contact provides an alternative to the use of permanent deposited contacts. Fabrication of the permanent contacts as is known in the art is time-consuming, and costly. In "Silicon Epitaxial Wafer Profiling Using the Mercury-Silicon Schottky Diode Differential Capacitance Methods", by Philip S. Schaffer and Thomas R. Lally, Solid State Technology, pp. 229-233, April 1983, is described the use of a mercury column in creating a mercury-Schottky diode for characterizing doping profiles of silicon-epitaxial wafers. In an article by Peter S. Burggraaf, entitled "C-V Plotting, C-T Measuring and Dopant Profiling: Applications and Equipment", Semiconductor International, pp. 29-35, October 1980, is described the use of a bottom contact mercury column such as is manufactured by MSI Electronics for measurements including capacitance-voltage and capacitance-time.

In an article by Albert Lederman entitled "Vacuum Operated Mercury Probe for C-V Plotting and Profiling", Solid State Technology, pp. 123-126, August 1981, is described the use of bottom mounted mercury contacts for replacing aluminum and C-V measurement techniques designed to characterize semiconductor properties.

In German Patent No. 2,741,682, issued to Antoine Torreiter, et al., is disclosed an apparatus for Capacitance-Voltage measurements including a top mounted mercury column where the mercury is contained in a perpendicular capillary above the semiconductor wafer body, and the other contact is a polished surface. The lower meniscus of the mercury column is adjustable by means of a vacuum on the upper end.

Problems may arise with currently available mercury probes which are bottom-mounted below the wafer and require physical contact to a large portion of the wafer top surface. Due to wafer contamination and moving of the back side contact, wafer mapping is not practical with these instruments. In addition, the prior art mercury probe uses a large mercury reservoir which has health implications. Also, currently-used back side contacts may cause microscopic damage to the wafer body being studied.

SUMMARY OF THE INVENTION

The present invention overcomes the foregoing-described difficulties with the prior art bottom-mounted mercury column, and provides an above-mounted mercury column which is kinematically controlled to contact the top surface of the wafer without scrubbing the wafer surface, resulting in reduced leakage currents and enhanced quality of Schottky measurements by minimizing contamination and surface defects. Utilizing the present invention, the wafer body is contacted by a capillary tube with very low mechanical stress, less than 1 psi, or the capillary tube may be maintained a slight distance above the wafer surface as desired. This feature further reduces the errors due to leakage currents. All measurements are reproducible to less than plus or minus 1.5%. The minimal front surface contact of the present invention, along with the consistent back surface contact, allows high resolution mapping capability with both metallic oxide semiconductors and Schottky wafers.

The present invention provides an apparatus for measurement of the electrical properties of a semiconductor wafer body. The apparatus includes means for supporting the semiconductor wafer body in a predetermined position. A top contact mercury probe is included for contacting the upper surface of the wafer body with a mercury column. The top contact mercury probe includes a capillary tube for containing the mercury column. A pneumatic control is provided for applying a vacuum or pressure to the mercury column within the capillary tube. A kinematically stable probe arm positioning means is provided and comprises a probe arm having the top contact mercury probe affixed thereto. The kinematically stable probe arm positioning means is for controlling the position of the capillary tube relative to the upper surface of the wafer body. A semiconductor wafer body horizontal and rotational movement means is provided for moving the wafer body rotationally or horizontally relative to the capillary tube. A first electrical contact is connected in circuit with the mercury column. A second electrical contact is provided for a path for current flow. In the case where the wafer body has no bottom insulating substrate, the second electrical contact may be connected in circuit with the means for supporting the semiconductor wafer body.

A measurement means is included for causing an electrical current to flow through the semiconductor wafer body and measuring the resultant electrical properties of the wafer body. The measurement means is connected in circuit with the first electrical contact and the second electrical contact.

To enable measurements of semiconductor wafer bodies having a bottom insulating substrate, the apparatus preferably further comprises a top side return contact for contacting the upper surface of the wafer body. The second electrical contact may be connected in circuit with the top side return contact.

The top side return contact includes a contact member having a flat bottom surface. The contact member has a first aperture therethrough for receiving the capillary tube. The contact member is provided with an annular groove therein and the flat bottom surface thereof. A vacuum means is provided for maintaining an intimate mechanical and electrical contact between the bottom surface of the contact member and the upper surface of the wafer body. The vacuum means is connected in fluid communication with the annular groove.

Preferably, the top side return contact further comprises contact member self-levelling and raising means, for causing the bottom surface of the contact member to intimately contact the upper surface of the wafer body when desired prior to the capillary tube coming to final position with the respective wafer body. The levelling and raising means comprises a threaded shaft affixed to the contact member in a predetermined position. A flange member is affixed to the capillary tube. The flange member has a second aperture passing through. The axis of the second aperture is in parallel relationship to the axis of the capillary tube. The shaft member slideably passes through the second aperture. An adjustable nut is provided for engaging the threaded shaft member above the flange member, whereby the nut may be adjusted to permit intimate contact of the bottom surface of the contact member or to prevent contact of the bottom surface of the contact member with the upper surface of the wafer body, as desired.

BRIEF DESCRIPTION OF THE DRAWINGS

For a better understanding of the invention, reference may be had to the company drawings exemplary of the invention, in which.

BRIEF DESCRIPTION OF THE PREFERRED EMBODIMENTS

Figure 1:
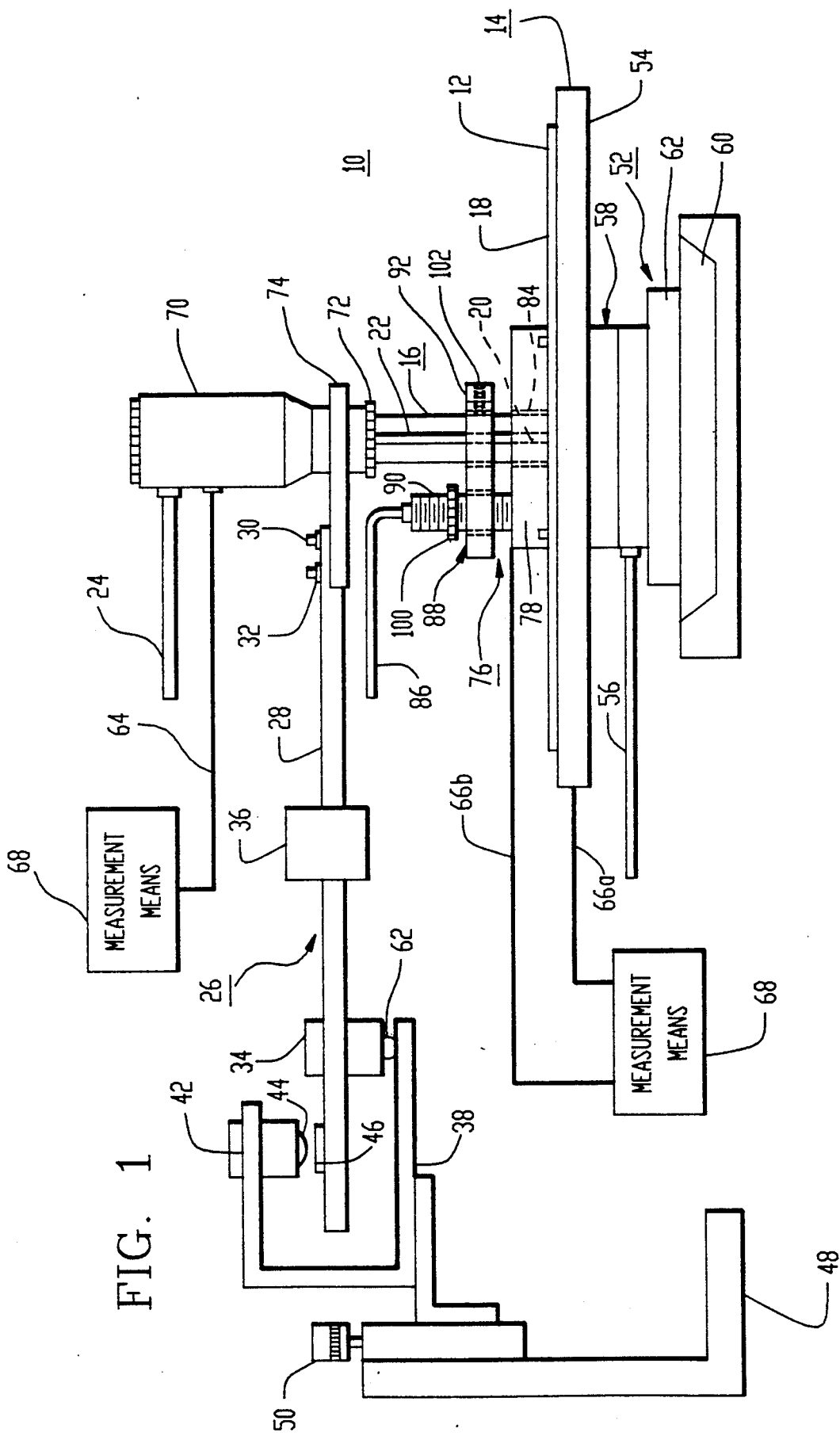
FIG. 1 is an elevational schematic view of the apparatus of the present invention.

Referring to FIG. 1 there is shown an apparatus 10 for the measurement of the electrical properties of the semiconductor wafer body 12. The apparatus includes means for supporting the semiconductor waferbody in predetermined position 14. A top contact mercury probe 16 is included for contacting the upper surface 18 with the wafer body 12 with the mercury column 20. The top contact mercury probe 16 includes a capillary tube 22 for containing the mercury column 20. A pneumatic control 24 is provided for applying vacuum or pressure to the mercury column 20 within the capillary tube 22. The pneumatic control 24 applies a vacuum to the column 24 when it is not in final position and applies pressure of 0.75 psi before measurements are taken, for example. Only about 0.8 gram of mercury is used in a capillary having 1.6 mm capacity.

A kinematically-stable probe arm positioning means 26 is provided for controlling the position of the capillary tube 22 relative to the upper surface 18 of the wafer body 12.

The kinematically-stable probe arm positioning means 26 shown in FIG. 1 is a commercially-available model SSM-240 manufactured by Solid State Measurements, Inc., the assignee herein. Another example of the kinematically-stable probe arm is disclosed in U.S. Pat. No. 3,628,137 dated Dec. 14, 1971 issued to Robert G. Mazur. The said U.S. Pat. No. 3,628,137 issued to Robert G. Mazur, one of the inventors, herein, is made a part hereof and is incorporated herein as though fully set forth.

Referring to FIG. 1, probe arm positioning means 26 comprises probe arm 28 which has the top contact mercury probe 16 affixed thereto by studs 30 and nuts 32. Probe arm 28 may be made of nickel-stainless steel, for example. The kinematically-stable probe arm positioning means also includes fulcrum 34 for supporting the probe arm 28. Probe arm weight 36 is used to fix the probe to the load. A load-bearing plate 38 supports the fulcrum 34 by means of bearing balls 62 which contact the fulcrum 34 by seating in the grooves provided in the fulcrum not shown in the drawing.

The probe arm 28 is raised and lowered pneumatically by means of a probe lift chamber 42. Included is a rubber diaphragm 44 to contact the arm lifter pad 46. The arm lifter pad 46 is covered with a wire mesh not shown. To raise the arm, air pressure inflates the diaphragm 44 to contact the wire mesh contained in the lifter pad 46. High quality control of the probe arm is made by controlling the load characteristics of the probe arm, see ASTM-F525 and Solid State Measurements, Inc. Technical Report, "Spreading Resistance Profiles in GaAs", page 7. The probe stand 48 supports the probe arm 26 and was made to align the height of the capillary tube 22 relative to the wafer body. Micropositioner 50 provides optimal positioning of the capillary tube with respect to the wafer body. For optimal positioning, the capillary tube 22 is adjusted so that the capillary tube will be on the same plane as the semiconductor wafer, or just above as desired, while using the micropositioner assembly 50.

The semiconductor wafer body horizontal and rotational movement means 52 is included for rotation of the wafer body either rotationally or horizontally relative to the capillary tube 22 for mapping purposes. The means for the supporting the wafer body 12 include vacuum chuck 54. The wafer body 12 is held onto the vacuum chuck 54 by means of a vacuum supplied by hose 56 with the vacuum chuck 54. The semiconductor wafer horizontal and rotational means 52 includes rotary stage 58 and sliding stage 60. The rotary stage 58 and sliding stage 60 are commercially available such as used in SSM Model 240 for rotational and sliding movement. The sliding stage 60 may be such as is manufactured by Velmarx, part number A4015A, for example. The rotary stage 58 attaches to the sliding stage 60 via aluminum mounting plate 62.

The first electrical contact 64 is connected in circuit with the mercury column 20 and measurement means 68.

Second electrical contacts 66a and 66b are included for providing a path for current flow between measurement means 68 and the wafer body 12.

The measurement means 68 is included for causing an electrical current to flow through the semiconductor wafer body 12 and measuring resultant electrical properties of the wafer body 12. Measurement means 68 as shown in FIG. 1 is connected in circuit with the first electrical contact 64 and the second electrical contact 66a or 66b and wafer body 12. The measurement means 68 can be any of the means known in the art such as described in the aforementioned "C-V Plotting, C-T Measuring and Dopant Profiling: Applications and Equipment" by Peter S. Burggraaf, for example.

The mercury column 20 is loaded onto the semiconductor wafer 12 by means of the kinematically mounted probe arm 26 whose operation is the same as the aforesaid model SSM 240 with regard to movement of the probe arm. The capillary tube 22 is held to the mercury trap 70 by means of a compression fitting and knurled screw 72. The mercury trap 70 prevents mercury from entering the pneumatic control 24 and it is attached to the probe arm 28 by means of an adapter 74 which is screwed onto the probe arm and clamps the mercury trap 70 in place.

In the case where the semiconductor wafer body 12 has an insulating substrate, for example, which prevents the second electrical contact 66a from being used, the second electrical contact 66b will be connected in circuit between contact member 78 and measurement means 68. To side return contact 76 gives the apparatus 10 of the present invention the capability of doing measurements on semiconductor wafers having a bottom insulating substrate layer. In the case where such an insulating substrate exists, the top side return contact 76 is used.

Figure 2:
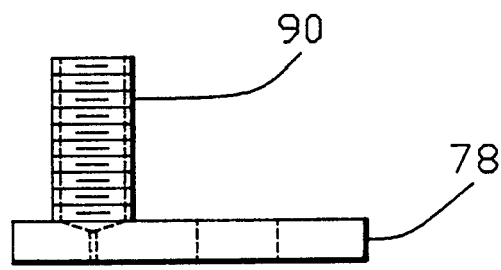
FIG. 2 is an elevational view of the contact member, together with the threaded shaft member affixed thereto.
Figure 3:
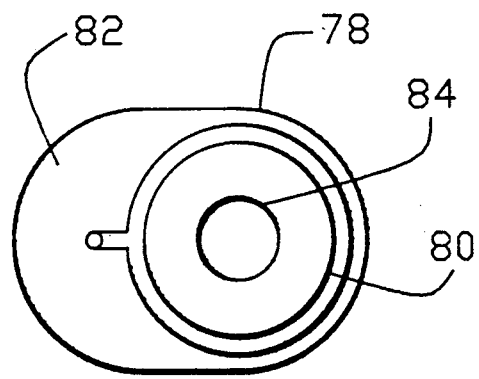
FIG. 3 is a bottom view of the contact member shown in FIG. 2.

Referring to FIGS. 1-3, the top side return contact 76 comprises a contact member 78 having an annular groove 80 in the flat bottom surface 82 shown in FIG. 3. The contact member has a second aperture therethrough 84 for receiving the capillary tube 22. Vacuum means 86 is provided for maintaining intimate mechanical and electrical contact between the bottom surface 82 of the contact 78 on the upper surface 18 of the wafer body 12. The vacuum means 86 is connected in fluid communication of the annular groove 80.

Figure 4:
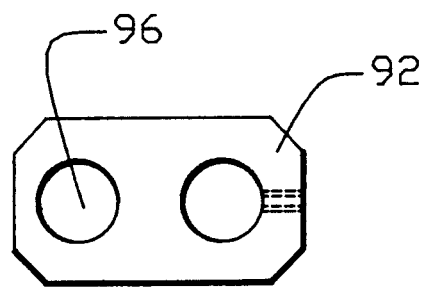
FIG. 4 is a plan view of the flange member.

Preferably, the top side return contact 76 further comprises contact member self-levelling and raising means 88 for causing the bottom surface 82 of the contact member 78 to intimately contact the upper surface 18 of the wafer body 12 when desired, when the capillary tube 22 comes to final position with respect to the wafer body. The contact member self-levelling and raising means 88 comprises a threaded shaft member 90. A flange member 92 shown in FIGS. 1 and 4 has a second aperture 94 passing therethrough. The axis 96 of the second aperture 94 as indicated in FIG. 4 is in parallel relationship of the axis 98 of the capillary tube 22. The shaft member 90 slideably passes through the aperture 94. The adjustable nut 100 engages the threaded shaft member 90 above the flange 92, whereby the nut 100 may be adjusted to permit intimate contact on the bottom surface 82 of the contact member 78 or may be adjusted to prevent contact of the bottom surface 72 of the contact member 78 with the upper surface 18 of the wafer body 12.

Set screw 102 is mounted in flange 92 and engages the capillary tube 22.

The top side return contact 82 when used to make an electrical connection uses the vacuum supplied from vacuum 86. The contact area of the contact member 78 is 0.024 cm$^2$ for example. When top contact 78 is not used it may be held off the wafer body 12 by adjusting the nut 100. Thus, the apparatus 10 of the present invention provides one with the option of which second electrical contact 66 to use depending on the type of wafer body 12 to be examined.

Using the apparatus of the present invention, one may do capacitance-voltage analysis on MOS structures to determine oxide thickness and diode doping profiles may be accomplished. A complete I-V analysis of the Schottky devices to determine Schottky characteristics prior to dopant profiling may also be done. Characteristics such as ideality factor, barrier height and series resistance values may be taken. Capacitance-voltage of the Schottky devices using an analysis adapted from ASTM procedure proposed in document 6B42 may be accomplished using the apparatus of the present invention. This analysis generates area vs. resistivity, and $C_{comp}$ vs. resistivity curves from data obtained from reference samples. The actual sample resistivity may be obtained by using successive approximation techniques on the two reference curves and applying these values to equations found in the ASTM document.

The capillary tube 22 can be set to allow the tube to stop 0.003 inches above the wafer surface, so that the wafer is contacted only by the mercury. This eliminates any contamination or damage due to capillary contact with the wafer. This feature virtually removes any restrictions on the thickness of the oxide that can be measured on MOS devices, and maintains the integrity of the surface for Schottky devices. Measurements done using this technique, together with the apparatus of the present invention, are reproducible to plus or minus 3%.

We claim:

1. An apparatus for measurement of electrical properties of semiconductor wafer body, said apparatus comprising:
    means for supporting said semiconductor wafer body in predetermined position;
    top contact mercury probe means for contacting the upper surface of said wafer body with a mercury column, said top contact mercury probe means including capillary tube means for containing said mercury column;
    pneumatic control means for applying a vacuum or pressure to said mercury column within said capillary tube means;
    kinematically stable probe arm position means comprising a probe arm having said top contact mercury probe means affixed thereto, said kinematically stable probe arm positioning means for controlling the position of said capillary tube means relative to the upper surface of aid wafer body;
    semiconductor wafer body horizontal and rotational movement means for moving said wafer body rotationally or horizontally relative to said capillary tube means;
    measurement means for causing an electrical current to flow through said semiconductor wafer body and for measuring resultant electrical properties of said wafer body;
    first electrical contact means connected in circuit with said memory column and said measurement means;
    second electrical contact means for providing a path for current flow between said measurement means and said wafer body; said measurement means connected in circuit with said first electrical contact means, said second electrical contact means and said wafer body.

2. The apparatus of claim 1, wherein said second electrical contact means is connected in circuit with said means ,for supporting said semiconductor wafer body, 3. The apparatus of claim 1, further comprising a top side return contact means for contacting the upper surface of said wafer body, said second electrical contact means, connected in circuit with said top side return contact means.

4. The apparatus of claim 3, wherein said top side return contact means, comprises a contact member having a flat bottom surface, said contact member having a first aperture means therethrough for receiving said capillary tube means, said contact member having an annular groove means therein in said flat bottom surface thereof, vacuum means for maintaining an intimate mechanical and electrical contact between said bottom surface of said contact member and said upper surface of said wafer body, said vacuum means connected in fluid communication with said annular groove means.

5. The apparatus of claim 4, wherein said top side return contact means, further comprises contact member self-leveling and raising means for causing the bottom surface of said contact member to intimately contact the upper surface of said wafer body when desired prior to said capillary tube means coming to final position with respect to said wafer body, said contact member self-leveling and raising means comprising a threaded shaft member affixed to the contact member in predetermined position, a flange member affixed to said capillary tube means, said flange member having a second aperture means passing therethrough, the axis of said second aperture means being in parallel relationship to the axis of said capillary tube means, said shaft member slideably passing through said second aperture means, adjustable nut means engaging said threaded shaft member above said flange member, whereby the nut means may be adjusted to permit intimate contact of said bottom surface of said contact member or to prevent contact of said bottom surface of said contact member with the upper surface of said wafer body as desired.

* * * * *